United States Patent [19]
Sommerfeldt et al.

[11] Patent Number: 5,544,018
[45] Date of Patent: Aug. 6, 1996

[54] ELECTRICAL INTERCONNECT DEVICE WITH CUSTOMIZEABLE SURFACE LAYER AND INTERWOVEN SIGNAL LINES

[75] Inventors: Scott C. Sommerfeldt, Round Rock; Thomas W. Rudwick, III, Austin; Robert F. Miracky, Cedar Park, all of Tex.

[73] Assignee: Microelectronics and Computer Technology Corporation, Austin, Tex.

[21] Appl. No.: 227,315

[22] Filed: Apr. 13, 1994

[51] Int. Cl.$^6$ .................................................. H05K 1/11
[52] U.S. Cl. .................................... 361/792; 361/803
[58] Field of Search .............................. 361/792–795, 361/803; 439/591, 91

[56] References Cited

U.S. PATENT DOCUMENTS

| | | |
|---|---|---|
| 3,777,221 | 12/1973 | Tatusko et al. . |
| 4,636,919 | 1/1987 | Itakura et al. . |
| 4,764,644 | 8/1988 | Reisman et al. . |
| 4,888,665 | 12/1989 | Smith . |
| 5,132,878 | 7/1992 | Carey . |
| 5,220,490 | 6/1993 | Weigler et al. . |
| 5,224,022 | 6/1993 | Weigler et al. . |
| 5,272,600 | 12/1993 | Carey . |

OTHER PUBLICATIONS

Miracky, et al., "Technologies for Rapid Prototyping of Multi-Chip Modules," IEEE, (ICCD 1991) 588–592.
Miracky, et al., "Laser Customization of a Multichip Module Substrate," IEEE, vol. 1, No. 3 (Sep. 1993) 387–389.
Burman, et al., "Programmable Multichip Modules," IEEE, (Apr. 1993) 28–35.
Raffel, "Programmable Technology for Rapid Prototyping," M.I.T. Lincoln Laboratory, (Feb. 14, 1994).

*Primary Examiner*—Bot L. Ledynh
*Attorney, Agent, or Firm*—Kevin L. Daffer

[57] ABSTRACT

Provided is an electrical interconnect cell intermittently spaced across a substrate to form an interconnect device or structure. The interconnect device is fully customizable or programmable upon the upper surface to accommodate various electrical components and connectivity to those components. The electrical interconnect device includes a plurality of intermittently spaced first pairs of upper and lower signal lines interwoven with a plurality of intermittently spaced second pairs of upper and lower signal lines. A bonding pad is arranged between adjacent upper and lower signal line pairs and can be connected thereto with conductive links placed upon the surface layer. Each bonding pad includes one or more pad vias which extend perpendicular to the upper surface to conductive structures arranged in lower layers. Approximately one-half of the array of bonding pads are connected to potential conductors. The pairs of upper signal lines can not only be linked, but also can be cut to form a more direct routing between target locations. Moreover, the upper and lower signal lines are connected in order for traces to extend across the entire interconnect structure for ease of testability.

29 Claims, 8 Drawing Sheets

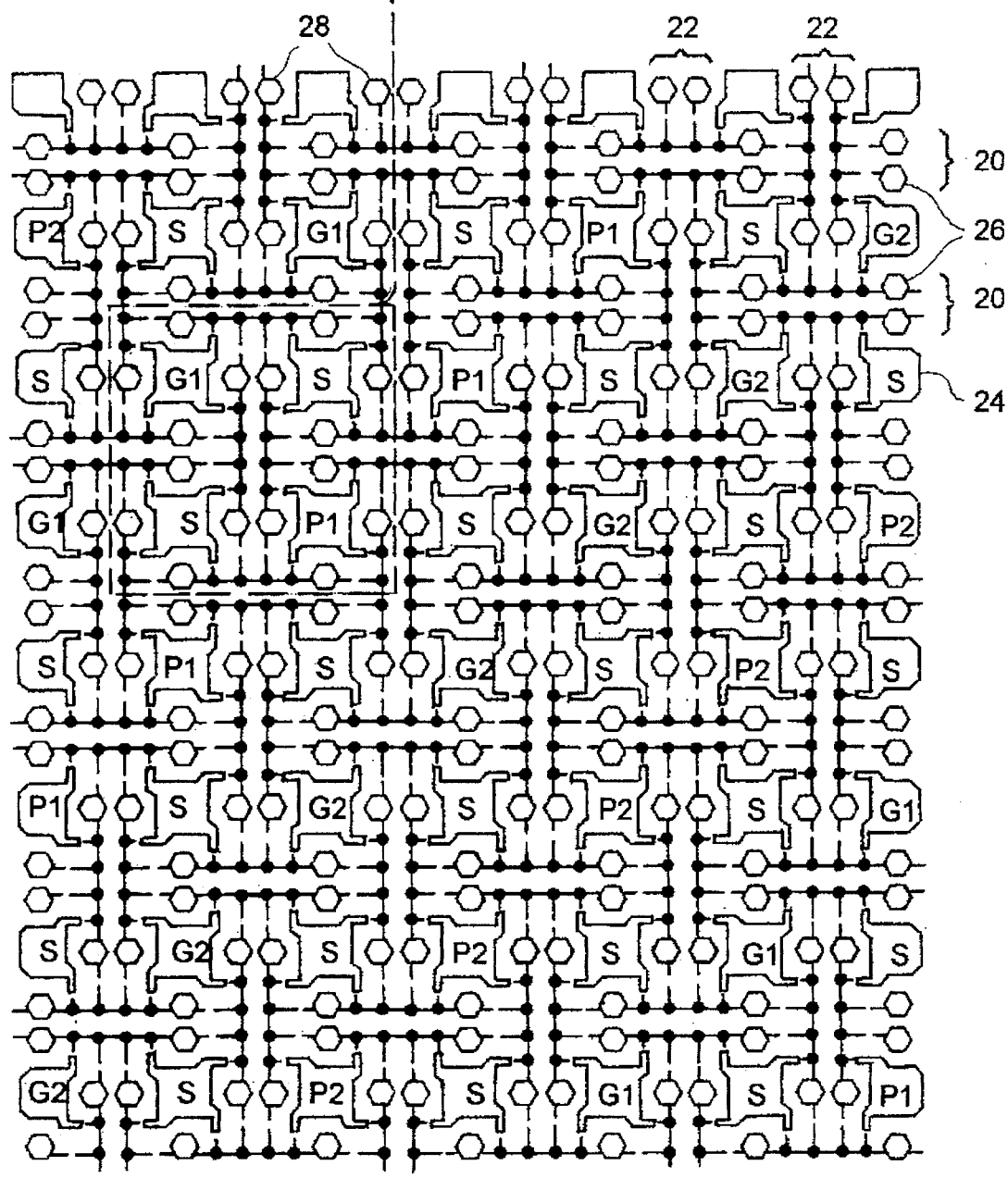

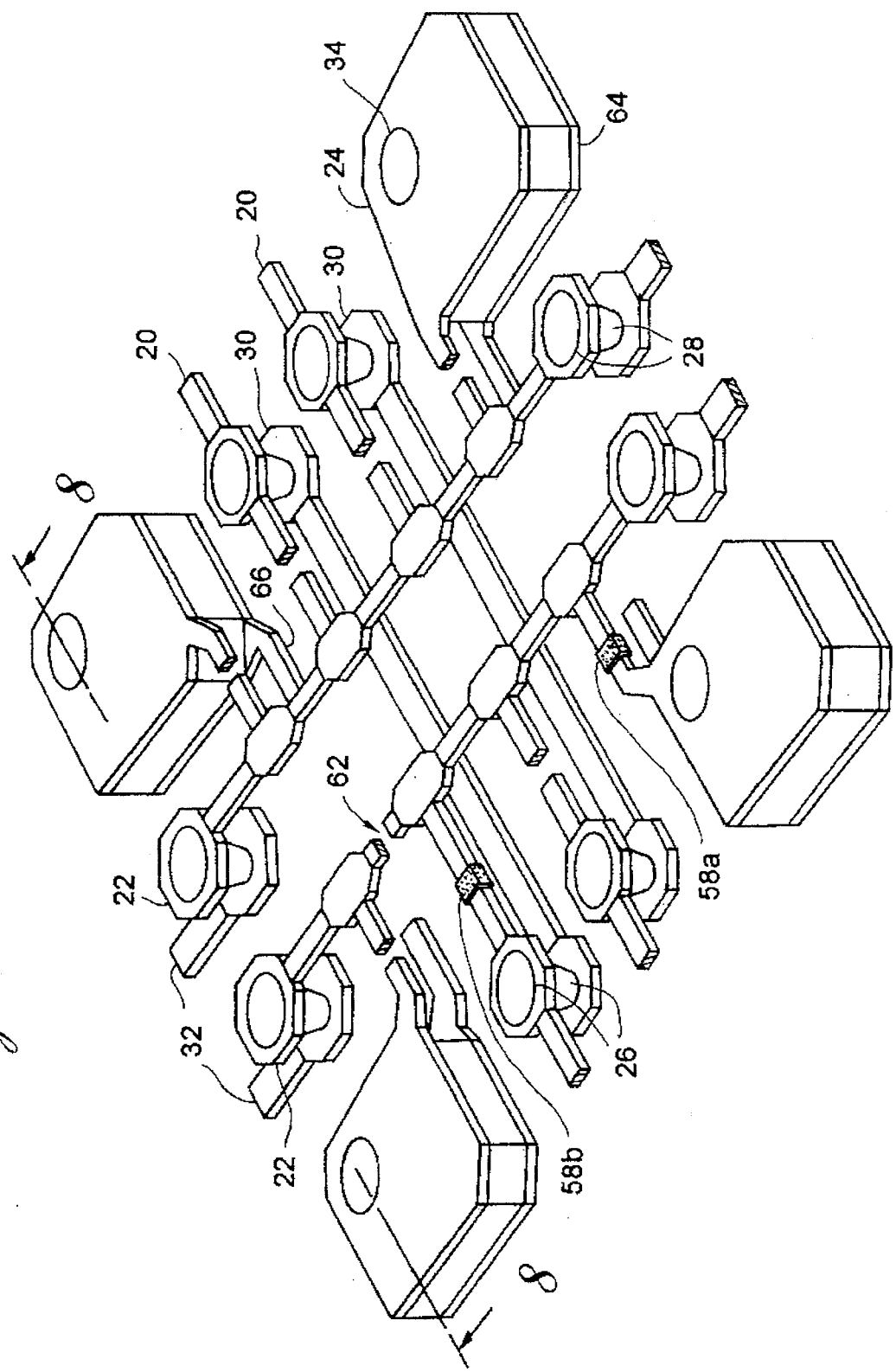

ELECTRICAL INTERCONNECT DEVICE WITH CUSTOMIZEABLE SURFACE LAYER AND INTERWOVEN SIGNAL LINES

The U.S. Government has a paid-up license in this invention and in limited circumstances to require the patent owner to license others on reasonable terms as provided for by the terms of contract No. J-FBI-89-103 awarded by Advanced Research Projects Agency (ARPA).

BACKGROUND OF THE INVENTION

1. Field of the Invention

This invention relates to an improved printed circuit board (PCB) and more particularly to a multi-chip module (MCM) interconnect structure or device which is fully programmable or customizable on the surface layer to meet application-specific needs.

2. Background of Relevant Art

PCBs or printed wiring boards (PWBs) are rigid or flexible single, double or multi-layered board having printed conductors placed upon or within the board material. A PCB is designed to receive separately manufactured electrical components and to interconnect those components into an overall circuit structure. The components or parts comprise integrated or discrete circuits well-known in the semiconductor arts.

Many PCBs are manufactured by the subtractive process in which conductive paths or lines are lithography formed upon a substrate material. Layers of lithography-formed lines are fabricated in successive steps necessary to achieve a multi-layered PCB. Each layer of conductive lines is laid out according to uniquely derived artwork designed to connect electronic devices placed upon the PCB. Artwork layout requires a significant amount of forethought and effort in order to ensure that, when reduced to a custom PCB, the PCB will perform according to its netlist requirements. If the netlist is determined to be improper or if slight modifications are necessary after the artwork and custom layers are formed, an entirely new netlist, including artwork and custom layers must be derived. Reduction of a netlist to a custom PCB is not only time consuming but also quite expensive. For reasons stated above, many manufacturers are focusing on multi-chip modules (MCMs) which are not fully customized at the fabrication stage. Instead, MCMs are mask produced according to a generic structure for most, if not all, of its layers.

Generally speaking, there are two types of MCMs: (i) semi-programmable MCMs or (ii) fully programmable MCMs. Semi-programmable MCMs generally utilize a prefabricated layer or layers arranged in an insulative substrate. The existing layers are generic to any component placement, configuration and netlist. To achieve design-specific interconnection, one or possibly two customized layers are fabricated upon the existing, generic layers. The custom layers are constructed according to the specific component arrangement and netlist, and are generally formed by the same lithography steps used to form a customized PCB layer. Since semi-programmable MCMs require customization of only the last one or two layers, manufacturing throughput is greatly enhanced relative to fully customized PCBs. While semi-programmable MCMs can implement a specific design in less fabrication time than a fully customized PCB, semi-programmable MCMs require more time to clean-room fabricate than a fully programmable MCM.

Fully programmable MCMs are ones which are fabricated according to a generic layout structure and are customized only upon the upper surface layer, generally at the site away from the location of the manufacturer. Fully programmable MCMs can therefore be customized without requiring lithography or clean room facilities. There are numerous types of fully programmable MCMs, some of which are described in U.S. Pat. No. 5,132,878 to Carey; U.S. Pat. No. 5,220,490 to Weigler, et al.; and, U.S. Pat. No. 4,888,665 to Smith.

Important goals necessary to achieve a fully programmable or fully customizable MCM are: routeability, testability and power distribution/availability. Routeability is often a measure of the efficiency by which a conductive line extends between target locations. Generally, the shorter the line the better. Optimal routeability implies that the surface target locations be configured as close to electrical components as possible. If the target locations are substantially displaced from the electrical components, long leads are necessary to connect the component to the target area. Thus, to optimize routeability, bonding pad locations must be arranged in a manner which can take into account any possible number, size, or shape of overlying electrical components.

In addition to routeability, fully customizable MCMs require ease of testability. It would be highly desirable to test each of the generically placed conductive lines prior to component placement on the interconnect structure and customization of that structure. As such, the generically placed conductive lines should be configured in a way that would allow the operator to test the resistivity of all of the lines by applying a test probe on only a few select locations. Provided the upper surface is properly programmed, pre-testing of the conductive lines ensures that the interconnect substrate will perform.

In addition to routeability and testability, fully programmable MCMs must also have readily available an evenly distributed set of potential conductors. Design-specific circuitry often requires more than one ground and one power potential. In many memory applications, two power potentials and two ground potentials are needed. A fully programmable MCM must therefore embody more than two potential conductors, and each potential conductor must exhibit a minimum resistance gradient from one end of the interconnect structure to the other. Accordingly, the potential conductors must be well distributed throughout the interconnect structure upon wide conductive paths. More importantly, each potential conductor must be arranged as close as possible to the bonding pad for delivering the appropriate potential to the sinking electrical component (or load). Thus, it would be desirable to have four possible potential conductors, and each potential conductor should optimally be available directly beneath a bonding pad arranged on the upper surface of the interconnect structure. Thus, the potential conductor can make direct connection to the bonding pad and carry the desired potential from the bonding pad to the electrical component with minimal resistive loss.

SUMMARY OF THE INVENTION

The problems outlined above are in large part solved by the improved, fully programmable MCM of the present invention. That is, the improved MCM hereof is not only fully programmable on only the surface layer, but also achieves a desired outcome of routeability, testability and power distribution/availability. Specifically, a plurality of first and second pairs of upper signal lines extend intermittently across the entire surface of the interconnect structure. The pairs of signal lines extend in close proximity to an array of regularly spaced bonding pads. During customization, the pairs of upper signal lines can be conductively linked with each other and with adjacent bonding pads. The pairs of upper signal lines can also be cut, and the combination of linking and cutting allows a more direct routing of signal lines between target locations. Moreover, the array of bonding pads are arranged at carefully spaced distances from each other in order to make short connection with, e.g., electrical component bond sites. Regardless of the pitch between integrated circuit bond sites, the array of bonding pads are spaced close enough to one another to ensure that leads which link the bonding pads to the component bond sites are fairly short.

In addition to routeability, all conductive trace elements defined as potential conductors and/or signal lines within the present interconnect structure can be tested at the edges of the structure by applying AC or DC current and measuring AC or DC voltage thereon. By routing the conductive lines (pairs of upper signal lines connected to pairs of parallel lower signal lines) completely across the interconnect substrate, each signal line can be tested at a readily available point near the edge of the interconnect substrate. Ease of testability assures the operator that all needed pre-formed generic conductive elements are fully operable prior to electrical component loading and customization. The fully programmable MCM hereof also utilizes potential conductors on at least one layer spaced from the upper surface and from the planes upon which the signal lines extend. The potential conductors are routed completely across the interconnect device for ease of testing and in a way which allows each conductor to be configured directly below a unique bonding pad. A pad via extends perpendicular from the plane formed by the potential conductors to a portion, and preferably one-half of all of the overlying bonding pads. Thus, the bonding pads arranged within the array of bonding pads upon the upper surface have direct connection to one of two possible ground potentials or one of two possible power potentials. By connecting a percentage of the bonding pads directly to potential conductors, the bonding pads make available various potentials as near as possible to the electrical components with minimal loss due to parasitics (e.g., resistance, capacitance and inductance).

Broadly speaking, the present invention contemplates an electrical interconnect device. The electrical interconnect device comprises a plurality of intermittently spaced first pairs of upper signal lines extending parallel to each other across a first plane. The first pairs of upper signal lines are connected at terminal ends thereof to a plurality of intermittently spaced first pairs of lower signal lines extending parallel to each other across a second plane. A plurality of intermittently spaced second pairs of upper signal lines also extend within the interconnect device parallel to each other and perpendicular to the first pairs of upper signal lines. The second pairs of upper signal lines are connected at terminal ends thereof to a plurality of intermittently spaced second pairs of lower signal lines extending parallel to each other across the second plane and perpendicular to the first pairs of lower signal lines. The first pairs of upper signal lines and the first pairs of lower signal lines are interwoven a spaced distance with the second pairs of upper signal lines and the second pairs of lower signal lines.

The electrical interconnect device further includes a plurality of spaced bonding pads. Each of the plurality of bonding pads is arranged upon the first plane in an area between adjacent first pairs of upper signal lines and between adjacent second pairs of upper signal lines. Each of the plurality of bonding pads are also arranged directly above an area between adjacent first pairs of lower signal lines and between adjacent second pairs of lower signal lines. The electrical interconnect device so formed further includes a plurality of pad vias extending perpendicular to the first plane a distance directly beneath respective bonding pads to a first set of four potential conductors arranged in spaced relation to one another within a third plane. The third plane is spaced from the second plane and the second plane is spaced from the first plane.

Each intermittently spaced first pair of upper signal lines includes two first upper signal lines extending parallel to one another. Each of the intermittently spaced first upper signal lines extends along a first axis. The intermittently spaced first upper signal line further includes an elongated distance extending along the first axis between each of the plurality of intervals formed by the intermittently spaced first upper signal line. The elongated distance is spaced parallel to and directly above each of the first pairs of lower signal lines. The second pairs of upper signal lines are configured with the second pairs of lower signal lines similar to the way in which the first pairs of upper signal lines are configured with the first pairs of lower signal lines. That is, the second pairs of upper signal lines comprise two intermittently spaced second upper signal lines extending parallel to one another. Each of the intermittently spaced second upper signal lines comprises a second axis along which each of the intermittently spaced second upper signal lines extends. Each of the intermittently spaced second upper signal lines further includes an elongated distance extending along the second axis between each of the plurality of intervals formed by the intermittently spaced second upper signal line. The elongated distance extending along the second axis is spaced parallel to and directly above each of the second pairs of lower signal lines.

The terminal ends of the first pairs of upper signal lines are connected to the terminal ends of the first pairs of lower signal lines by a respective plurality of first signal vias. Similarly, the terminal ends of the second pairs of upper signal lines are connected to the terminal ends of the second pairs of lower signal lines by a respective plurality of second signal vias. The first and second signal vias are arranged between adjacent bonding pads and extend between the first and second planes, perpendicular thereto.

The electrical interconnect device further includes an electrical component configured above the first plane and having at least one bond area adapted for connection to one of the plurality of bonding pads. At least one of the plurality of bonding pads is further adapted to receive a bond wire electrically coupled from another one of the plurality of bonding pads. Still further, each of the plurality of bonding pads is adapted for conductive linkage to one of the first pairs of upper signal lines and to one of the second pairs of upper signal lines. The first plane is exposed in order for the first pairs of upper signal lines and the second pairs of upper signal lines to be accessed and separated at one or more points thereon.

The electrical interconnect device can further include a fourth plane separated from the third plane. The fourth plane includes a second set of four potential conductors arranged in spaced relation to one another. The second set of four potential conductors can be electrically connected to the first set of four potential conductors within the third plane by pad vias extending directly beneath respective bonding pads, from the third plane to the fourth plane.

The present invention further contemplates an interconnect cell regularly spaced and electrically connected with another interconnect cell across an interconnect device. The interconnect cell comprises a first pair of upper signal lines extending parallel to each other along a first axis and terminating upon first signal vias arranged at opposing ends of each line of the first pair of upper signal lines. The interconnect cell further includes a first pair of lower signal lines extending parallel to each other along the first axis in a plane spaced below the first pair of upper signal lines. The first pair of lower signal lines terminate upon the first signal vias, whereby the first signal vias electrically connect the first pairs of lower signal lines to respective first pair of upper signal lines. The interconnect cell still further comprises a pair of bonding pads arranged coplanar with the first pair of upper signal lines. The first pair of upper signal lines extend at least partially between the bonding pads such that one of the first pair of upper signal lines is spaced from and adapted for connection to one of the pair of bonding pads, and the other of the first pair of upper signal lines is spaced from and adapted for connection to the other of the pair of bonding pads.

BRIEF DESCRIPTION OF DRAWINGS

Other objects and advantages of the invention will become apparent upon reading the following detailed description and upon reference to accompanying drawings in which:

FIG. 2 is a plan view of elements arranged upon a first plane of a detailed segment of the electrical interconnect device according to the present invention;

FIG. 7 is a perspective view of the first and second planes embodying the interconnect cell of FIG. 6;

Figure 1:
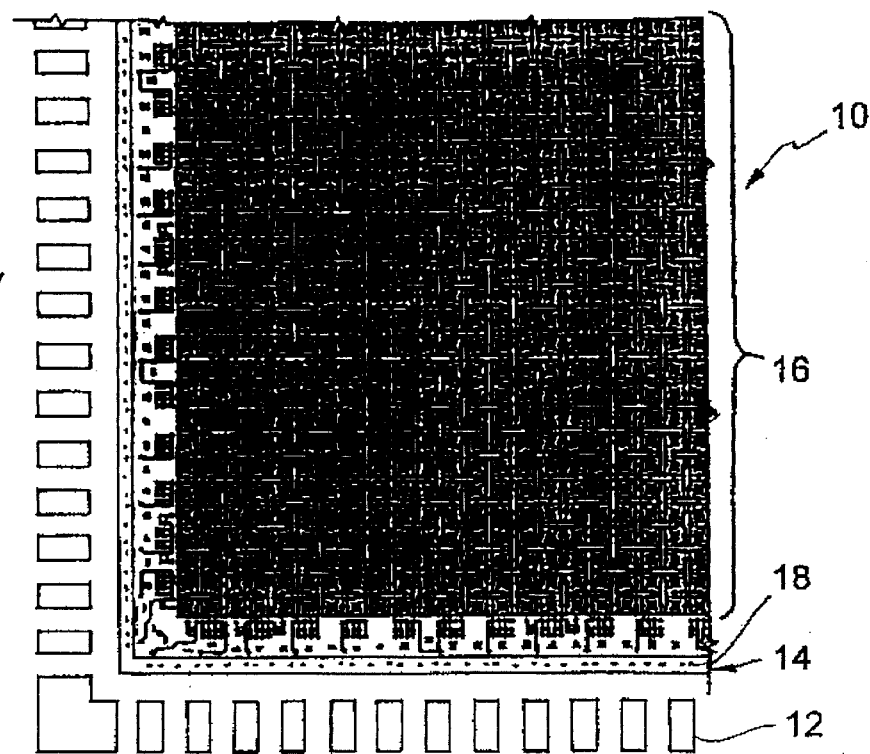
FIG. 1 is a top plan view of a portion of an electrical interconnect device according to the present invention.

While the invention is susceptible to various modifications and alternative forms, specific embodiments are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a top plan view of an electrical interconnect device 10 is shown. Electrical interconnect device 10 shares many features with PCBs. For example, device 10 includes edge connectors 12 which receive signals from conductors arranged upon and within device 10 and allows for external connection thereto. It is understood that the depiction of FIG. 1 is only a portion of an interconnect device, and that the interconnect device can be cut into segments depending upon the desired size of the card. If the segment is chosen as an outer segment, as shown in FIG. 1, then interconnect device 10 is illustrative of surface potential conductors 14 arranged near the periphery of device 10 between edge connectors 12 and internal trace elements 16.

Surface potential conductors 14 are arranged to receive ground and power potentials from an external source and to deliver those potentials to the internal trace elements 16 through path potential vias 18. Potential vias 18 extend from the upper surface from trace connectors coupled between potential vias 18 and potential conductors 14 to lower planes containing potential conductors described herein below. Each potential via 18 can receive one potential conductor, and up to four potential conductors can be embodied within the lower planes. If four potential conductors are placed within lower planes, two conductors of the four conductors, e.g., power potential conductors, can be shorted together by connecting respective power potentials to a pair of potential vias 18 and connecting both of those potential vias to one of the two surface potential conductors 14, as shown. The other two potential conductors, e.g., ground potential conductors, can be connected to respective potential vias 18 and connected together to the other of the two surface potential conductors 14, as shown. Thus, FIG. 1 illustrates each potential via 18 as containing one of the four potential conductors arranged at lower elevations, and the shorting of two of the lower embodied potential conductors to one surface potential conductor 14 and shorting of the other two lower embodied potential conductors to the other surface potential conductor 14. By severing the link between a potential via 18 and surface potential conductors 14, shorting of the pairs of underlayer potential conductors is avoided and all four potential conductors can be brought to the surface upon respective potential vias 18. Further description of underlayer potential conductors and arrangement of vias will be set forth in detail below.

Internal trace elements 16 are descriptive of a regular pattern of surface conductors. As shown in FIG. 2, the upper surface (first plane) of interconnect device 10 contains numerous conductive elements intermittently spaced in a repetitive array or pattern. Conductive elements 16 upon the first plane of interconnect device 10 include a plurality of intermittently spaced first pairs of upper signal lines 20. Each pair of first pairs of upper signal lines 20 are shown extending in intermittent fashion across the entire horizontal surface of interconnective device 10, and the intermittent spacing can be a uniform or variable spacing. Also arranged perpendicular to the first pairs of upper signal lines 20 are intermittently spaced second pairs of upper signal lines 22. Each of the second pairs of upper signal lines 22 extend in intermittent (uniform or variable) fashion across the entire upper surface of interconnect device 10. Also arranged upon the first plane, coplanar with first and second pairs of upper signal lines 20 and 22, is an array of regularly spaced bonding pads 24. Each bonding pad 24 is arranged between adjacent first and second pairs of upper signal lines 20 and 22.

It is understood that the detailed segment of electrical interconnect device 10, shown in FIG. 2, is merely a segment or portion of interconnect device 10, and that each segment shown in FIG. 2 is merely the first plane (upper layer) of conductive elements arranged upon interconnect device 10. The pattern of first and second pairs of upper signal lines 20 and 22, as well as bonding pads 24 extend across the first plane the entire length and width of interconnect device 10. Portions of interconnect device 10 can be sliced to present an interconnect grid upon which electrical components can be arranged and interconnected. Thus, it is important to note that any portion of an entire electrical interconnect device 10 can be selected as the interconnect vehicle upon which numerous electrical components and associated netlists are arranged. Bonding pads 24 can be used to make connection to the next level of interconnect devices, i.e., a board or panel, and edge connectors 12 are not necessary for making such a connection.

FIG. 2 further illustrates first signal vias 26 arranged at or near the terminal ends of each portion of the intermittent pattern defined by first pairs of upper signal lines 20. Arranged at or near the terminal ends of each of the second pairs of upper signal lines 22 are second signal vias 28. First and second pairs of upper signal lines 20 and 22, bonding pads 24, and first and second signal vias 26 and 28 comprise any conductive, metallic material, gold being a preferred material. Bonding pads 24 are dimensioned to receive a wire bond derived from an external site such as, for example, an electrical component or another bonding pad. A suitable bond pad dimension can be, for example, 120 microns square. Suitable dimensions for each signal line of the first and second pairs of upper signal lines are 10–30 microns wide and approximately 6 microns thick. First and second signal vias 26 and 28 have an upper surface diameter (diameter as measured on the first plane) anywhere between 10 to 30 microns and, if lower resistivity connections are needed, vias 26 and 28 can have a diameter approaching 30 microns.

Figure 3:
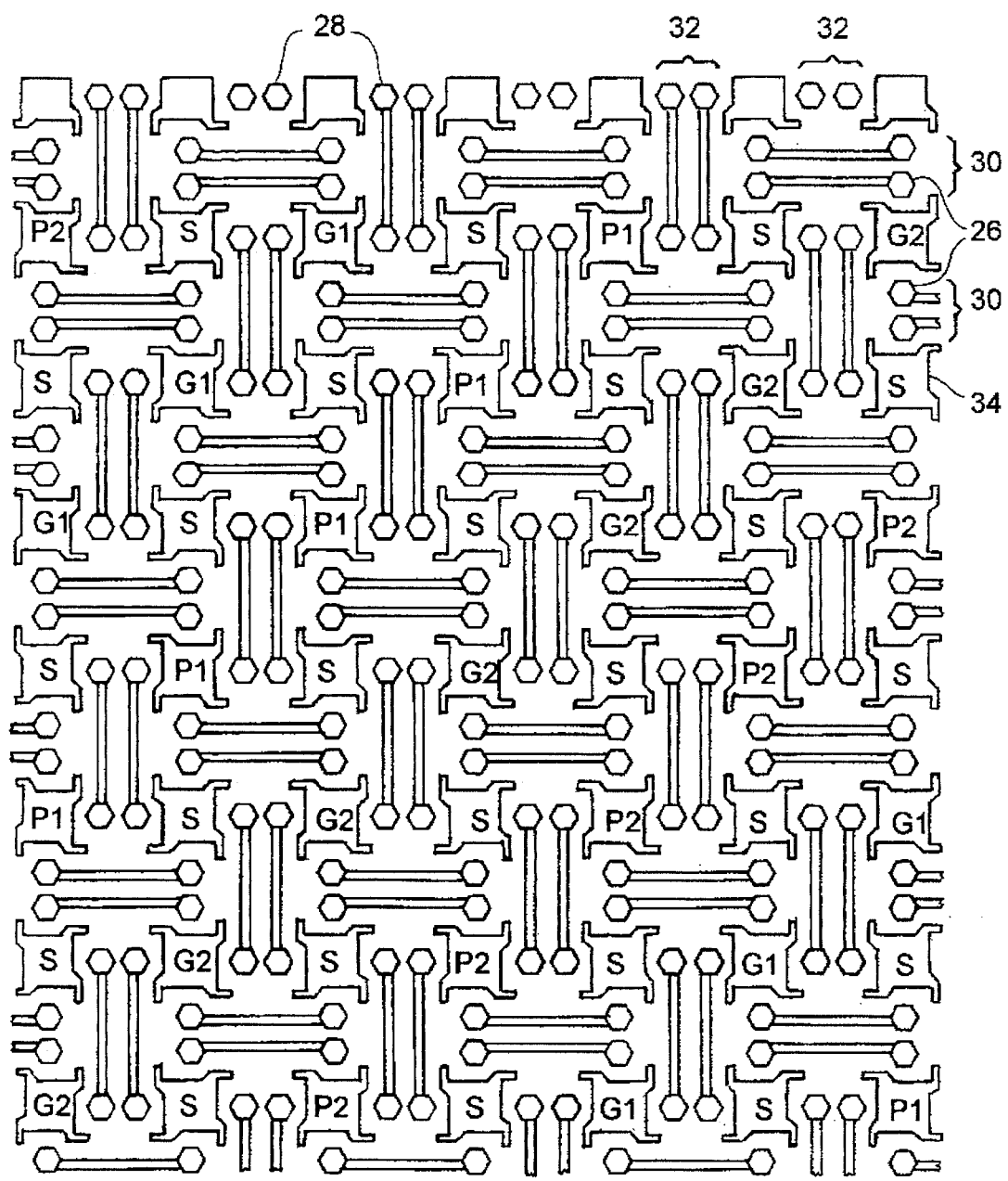
FIG. 3 is a plan view of elements arranged upon a second plane of the detailed segment of the electrical interconnect device according to the present invention.

First and second vias 26 and 28 extend from the first plane shown in FIG. 2, perpendicular to the first plane, to a second plane shown in FIG. 3. The second plane of FIG. 3 is arranged a spaced distance directly below the first plane of FIG. 2 and is aligned with the first plane portion. Vias 26 and 28 extend from the first plane to the second plane to make electrical connection with underlying conductors.

Referring to FIGS. 2 and 3, first signal vias 26 make connection between the terminal ends of each of the first pairs of upper signal lines 20 to the terminal ends of each of first pairs of lower signal lines 30. Likewise, second signal vias 28 make connection between each of the terminal ends of second pairs of upper signal lines 22 to the terminal ends of each of the second pairs of lower signal lines 32. It is appreciated that first signal vias 26 connect a trace length of first pairs of upper signal lines 20 with first pairs of lower signal lines 30 across the entire interconnect device 10, and that the trace resides upon dissimilar planes (i.e., first plane and second plane). Moreover, second signal vias 28 connect a trace length extending across the entire interconnect device 10 linking second pairs of upper signal lines 22 with second pairs of lower signal lines 32 upon dissimilar first and second planes. Interconnection of first pairs of upper and lower signal lines 20 and 30 are interwoven with second pairs of upper and lower signal lines 22 and 32 such that pairs of signal lines extend vertically and horizontally across interconnect device 10 between bonding pads 24. Moreover, bonding pads 24 upon the first plane, shown in FIG. 2, extend downward to the second plane, shown in FIG. 3 by pad vias 34. Pad vias 34 can be of any diameter as small as 10 microns and as large as the periphery of bonding pad 24. Moreover, each bonding pad 24 can have more than one pad via, a suitable number, however, is one. Accordingly, in situations where bonding pad 24 carries a potential voltage value, each pad can utilize a single via, and each pad via can have a diameter substantially equal to the bond pad upper surface dimension, e.g., 120 microns square. Elongated trace elements of first pairs of upper signal lines 20 with first pairs of lower signal lines 30 allow interconnected signal lines to extend across the entire interconnect device 10. Each signal line can then be tested at end points near horizontal edges of interconnect device 10. The second pairs of upper signal lines 22 interconnected with second pairs of lower signal lines 32 can also be tested at the end points near the vertical edges of interconnect device 10. By applying probes near the edges of interconnect device 10, all the signal lines can conveniently be tested (resistance, capacitance and inductance testing) to ensure that they have been properly processed. Signal lines, bonding pads, signal vias and pad vias arranged upon the first plane, shown in FIG. 2, and upon the second plane, shown FIG. 3, are pre-fabricated according to known masking and photolithography technologies. The first plane is formed after the second plane and is spaced therefrom by a suitable insulative material such as a polyimide.

Figure 4:
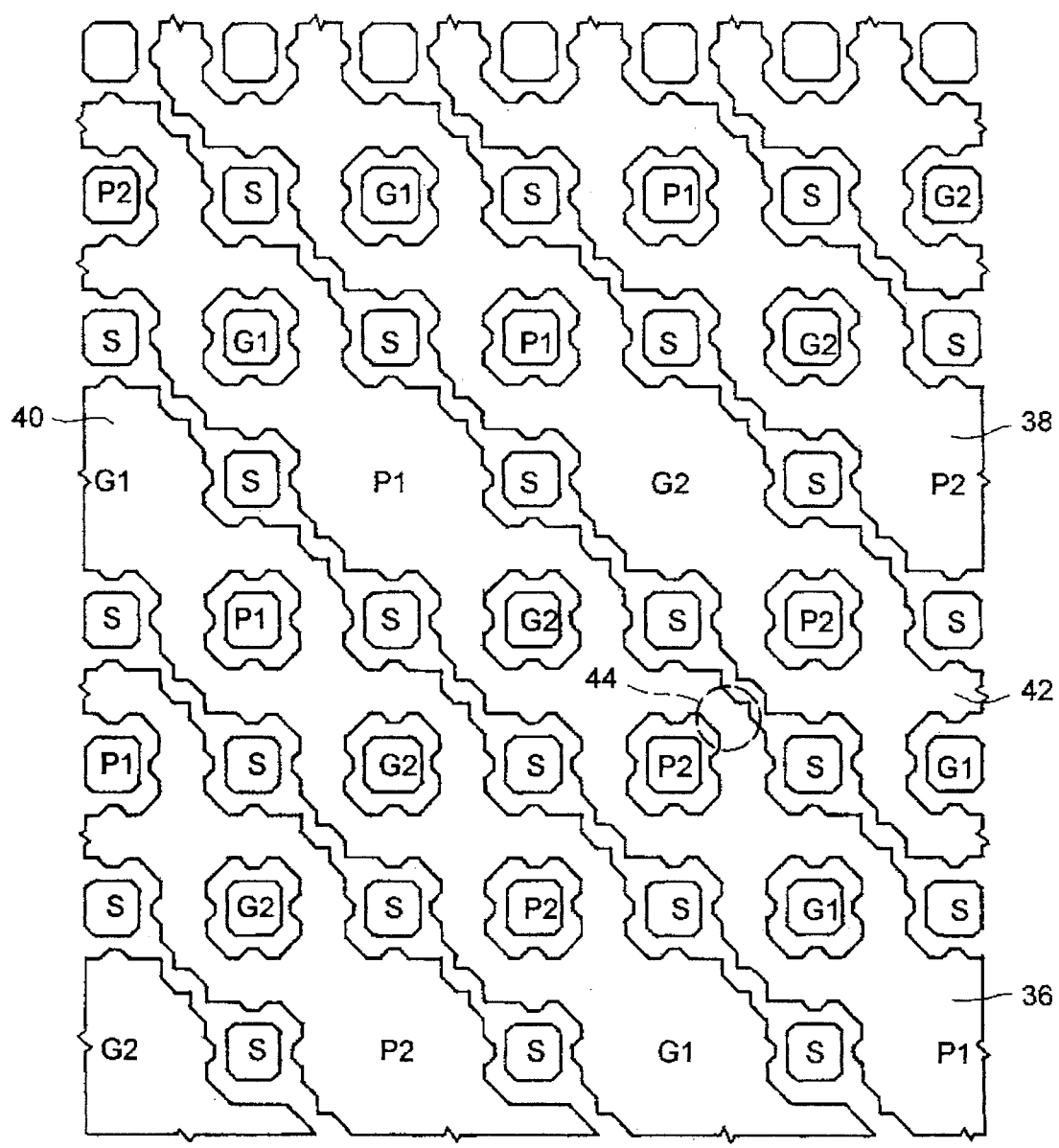
FIG. 4 is a plan view of elements arranged upon a third plane of the detailed segment of the electrical interconnect device according to the present invention.

Referring now to FIG. 4, a third plane is shown of the detailed segments identical in location to the top plan views of FIGS. 2 and 3. The third plane contains a first set of four potential conductors spaced from one another and extending diagonally across the entire interconnect device 10. The third plane is placed a spaced distance below the second plane. The four potential conductors include a first power ("P1") conductor 36, a second power ("P2") conductor 38, a first ground ("G1") conductor 40 and a second ground ("G2") conductor 42. Thus, the third plane embodies four different voltage potential levels which are connected through pad vias 34 to bonding pads 24. First power conductor 36 thereby connects to bonding pads 24 labeled P1 on FIG. 2; second power conductors 38 are connected to bonding pads 24 labeled P2 on FIG. 2; first ground conductors 40 are connected to bonding pads labeled G1 on FIG. 2; and second ground conductors 42 are connected to bonding pads labeled G2 on FIG. 2. Pad vias 34, extend from the first plane from bonding pads 24, through the second plane, and onto potential conductors arranged upon the third plane. Pad vias 34 therefore make available direct connection to bonding pad locations arranged in a regular pattern across the upper surface of interconnect device 10. Large diameter pad vias 34 allow low resistive contact from the potential conductors to select bonding pads. Further, first set of potential conductors 36–42 are shown much wider than the signal lines and, are preferably as wide as if not wider than the pad vias. Even in bifurcated areas 44, first set of potential conductors 36–42 are preferably at least the thickness of pad vias 34.

Figure 5:
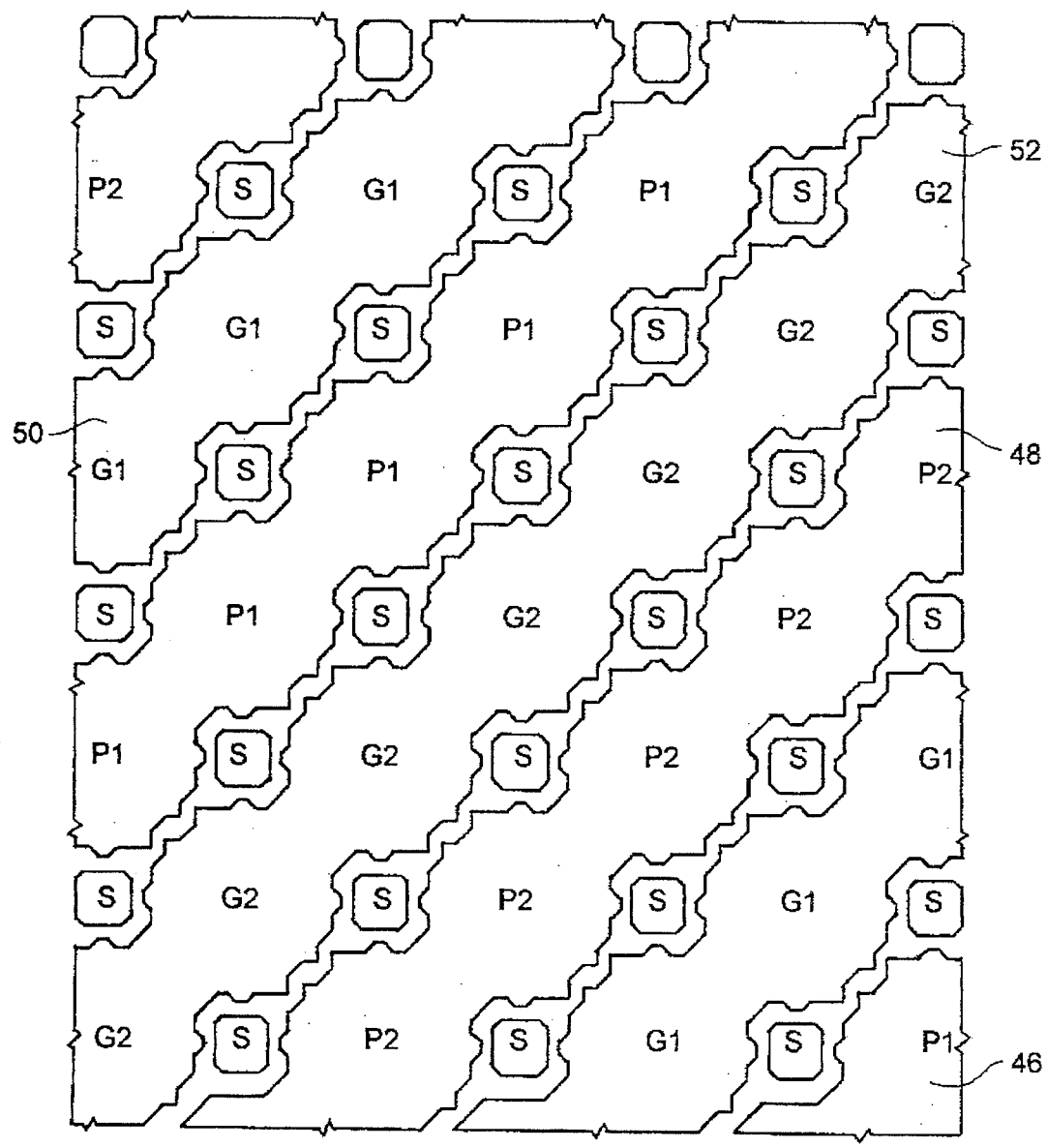
FIG. 5 is a plan view of elements arranged upon a fourth plane of the detailed segment of the electrical interconnect device according to the present invention.

It is understood from the drawings of FIGS. 2–4 that first and second signal vias 26 and 28, respectively, extend only between the first and second planes, whereas pad vias 34 extend from the first plane, through the second plane, through the third plane and, if desired, to a fourth plane. The fourth plane is shown in FIG. 5 and indicates a second set of potential conductors comprising first power ("P1") conductor 46, second power ("P2") conductor 48, first ground ("G1") conductor 50 and second ground ("G2") conductor 52. The second set of potential conductors 46–52 are arranged diagonally in the fourth plane separate from the third plane and perpendicular to the arrangement of conductors within the third plane. Pad vias 34 extend not only from the first to the second plane, but also from the second to the third plane and from the third plane to the fourth plane to ensure high quality power distribution along not only one but two planes within interconnect device 10. It is understood, however, that based upon design constraints, the fourth plane may be omitted and power conduction be obtained solely from the third plane. However, the fourth plane does provide additional advantages, wherein there are no bifurcated areas and that the minimum conductor width in plane four far exceeds the minimum conductor width in plane three and/or the pad via diameter. Taken in combination, FIGS. 1–5 illustrate dedicated pads denoted as signal "S" pads which can comprise approximately 50% of the total pad availability. Signal pads extend downward through pad vias 34 from the first plane, through the second, through the third and through the fourth plane and below. Similar to S pads, each of the P1, P2, G1, and G2 bonding pads also extend downward from the first plane to the third and fourth planes by pad vias 34. The unique arrangement shown in FIGS. 1–5 allows bonding pads denoted as S, P1, P2, G1, and G2 to be electrically isolated from one another and to extend directly below the upper surface pad area to underlying planes with minimal parasitic loss.

Figure 6:
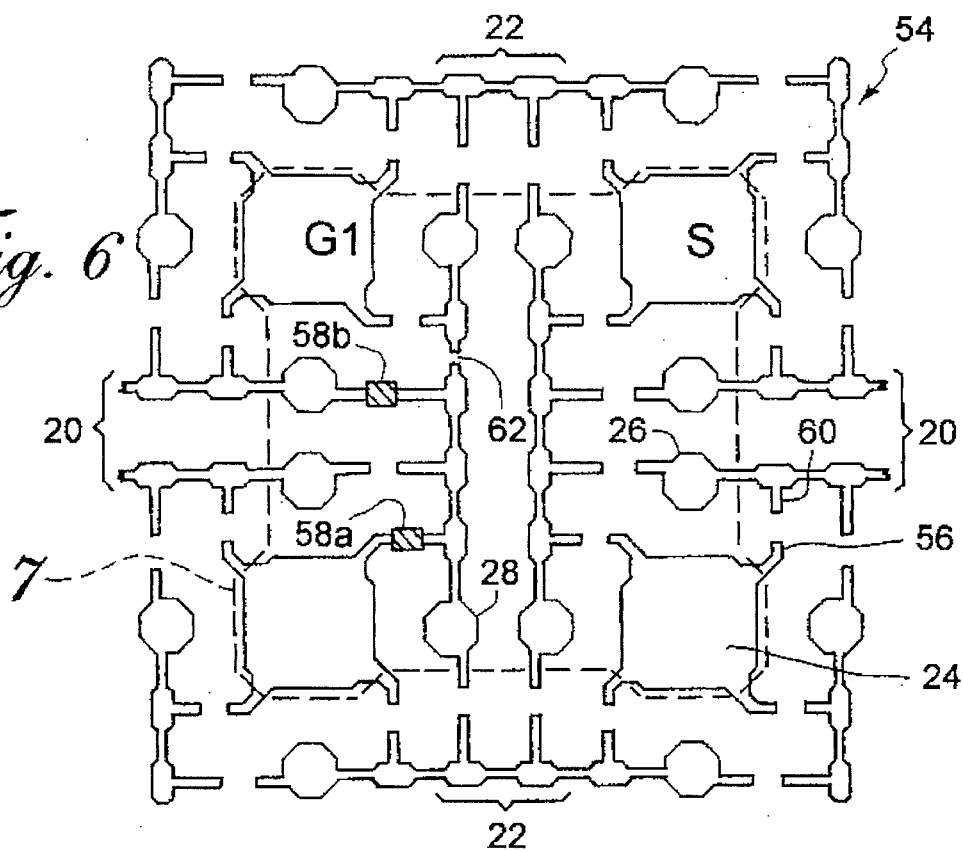
FIG. 6 is a further enlarged plan view of a portion of the first plane taken from FIG. 2 illustrating one interconnect cell of numerous interconnect cells regularly spaced across the electrical interconnect device according to the present invention.

Referring now to FIG. 6, an enlarged plan view of portion 6 of the first plane taken from FIG. 2 is shown. Specifically, FIG. 6 illustrates an interconnect cell 54. Interconnect cell 54 has a regular pattern spaced a unique pitch distance across a substrate to form interconnect device 10. The pitch distance is determined by the length and width of interconnect cell 54. Each interconnect cell includes four bonding pads 24. The cell selected and shown in FIG. 6 has at least two bonding pads denoted as G1 and S. However, it is understood that other types of bonding pads, i.e., P1, P2 or G2 can be substituted for the G1 bonding pad. Preferably, there remains two signal pads within the array of four bonding pads within cell 54, the other pads being either P1, P2, G1 and/or G2.

Each bonding pad, shown in FIG. 6 includes four protrusions 56 which extend toward one signal line of the first and second pairs of upper signal lines 20 and 22, respectively. A conductive link 58 can be formed, for example, by a laser beam focused upon the first plane through a microscope. The laser beam, derived from a CW-Argon laser can be used to irradiate a Pd-doped catalyst film, followed by chemical removal of the non-irradiated film and electroless plating with copper at the link sites. A description of conductive linking by laser is provided in Hirsch, et al., "Laser Customization of a Multichip Module Substrate", IEEE Trans. on the VLSI Systems, Vol. 1, No. 3, September, 1993 (herein incorporated by reference).

Protrusions 56 align with and are capable of linking with closely spaced protrusions 60 upon first and second pairs of upper signal lines 20 and 22. The protrusions are preferably of the same length and width in order to provide thermal matching during laser link operations.

Laser link 58a can be used to connect protrusions 56 to one of the first and one of the second pairs of upper signal lines 20 and/or 22. Laser Link 58a therefore allows selective connection between the bond pads and the signal lines.

Similar to laser link 58a, additional laser links can be used to connect one or both of the first pairs of upper signal lines 20 with one or both of the second pairs of upper signal lines 22. Laser link 58b is used to perform the connection between one of the first and/or one of the second pairs of upper signal lines 20 and 22. Laser link 58b therefore allows corner-turning routeability. Good thermal matching between adjacent protrusions of link 58b ensures proper connectivity. Links 58a and 58b are performed entirely upon the first plane, or upper surface of interconnect device 10. To ensure full routeability and to maximize performance, unused trace elements (upper signal lines 20 and/or 22) can be laser cut at designated areas where the upper signal lines are of narrow width. Shown in FIG. 6 is one of the second pairs of upper signal lines 22 cut at location 62. Laser cutting, in conjunction with laser linking affords the operator full customization and direct routeability for any user-specified component layout and netlist. Given an understanding of laser linkage and laser cutting upon the upper signal lines 20 and 22, it is appreciated that to form a corner-turn, one link and two cuts are necessary. To form a tee connection, only one link and one cut are needed. To connect one of the first pairs of upper signal lines 20 to one of the second pairs of upper signal lines 22, only one link is needed. Still further, the connection of a bonding pad to an upper signal line only requires a single link. A more detailed discussion of the various link and cut arrangements is provided below in reference to FIG. 10.

Referring now to FIG. 7, a perspective view of the first and second planes embodying the interconnect cell of FIG. 6 is shown. In particular, FIG. 7 more clearly illustrates first signal vias 26 which connect a pair of upper signal lines 20 to a pair of lower signal lines 30. The second signal vias 28 are shown connecting a pair of second upper signal lines 22 to a pair of second lower signal lines 32. Each bonding pad 24 includes a pad via 34 to make connection between the first plane and the second plane, as well as between the second plane and lower planes, i.e., either third plane or third and fourth planes. Below bond pad 24 is a similar conductive structure having similar geometric proportions to pad 24. Although only one protrusion 66 is shown in FIG. 7 for simplicity, structure 64, similar to pad 24, may include any number of protrusions, preferably four protrusions. Protrusion 66 lies directly below the link locations of 58a such that if "burn-through" occurs at the upper surface, link reliability will be maintained on the lower (or second plane). Thus, protrusion 66 adds to the reliability of bonding pad connectivity.

Figure 8:
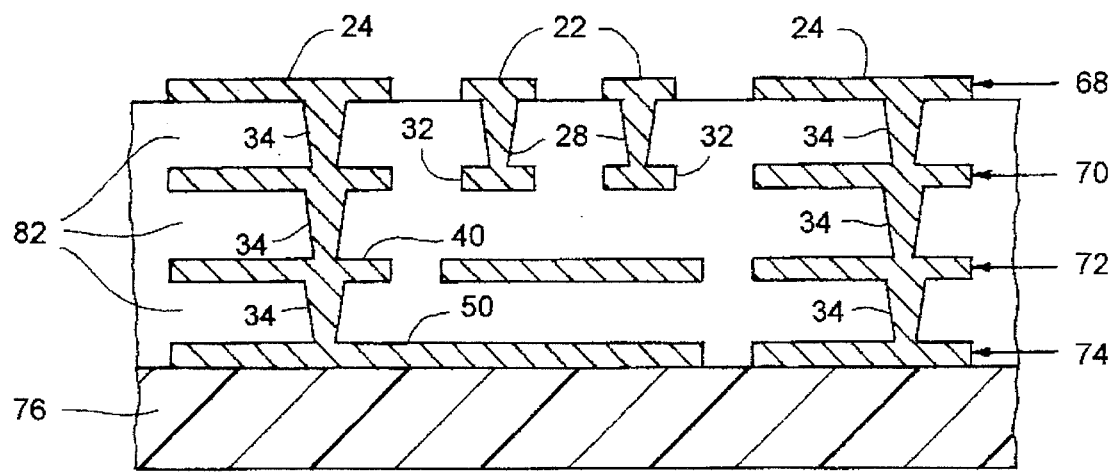
FIG. 8 is a cross-sectional view along plane 8—8 of FIG. 7, and is further illustrative of underlying third and fourth planes.

Referring now to FIG. 8, a cross-sectional view taken along plane 8—8 of FIG. 7 is shown. Illustrated in FIG. 8 are four planes of conductors which include the two planes shown in FIG. 7. The four planes include a first plane (or surface layer) 68, a second plane 70, a third plane 72 and a fourth plane 74. As described above, first plane 68 is shown in FIG. 2, second plane 70 is shown in FIG. 3, third plane 72 is shown in FIG. 4 and fourth plane 74 is shown in FIG. 5. Pad vias 34 are depicted connecting bonding pads 24 to underlying conductive structures including first and second sets of potential conductors arranged on the third and fourth planes 72 and 74, respectively. Second signal vias 28 are shown connecting terminal ends of second pairs of upper signal lines 22 to terminal ends of second pairs of lower signal lines 32. First set of potential conductors are shown on third plane 72, and the second set of potential conductors are shown on fourth plane 74. Given that the left-most bonding pad is designated at G1, the G1 bonding pad 24 connects downward to the first and second set of potential conductors and specifically to first ground conductor 40 (within third plane 72) and to first ground conductor 50 (within fourth plane 74).

Each bonding pad 24 can be connected to a thermally conductive and electrically insulative material 76 (preferably ceramic) through conductive linkages 78. A suitable ceramic comprises $Al_2O_3$, and functions as a thermal sink for any heat buildup within the composite substrate. Material 76 thereby sinks heat away from the upper active areas. Material 76 can be of any thickness sufficient to sink substantial amounts of heat away from the first, second, third and fourth planes, a suitable thickness being 40 mils.

First, second, third and fourth planes are derived from a masking process upon substrate material 76 during deposition steps, followed by selective etching. A dielectric material 82 exists and is coated between planes 68 through 74. The dielectric material also serves to separate spaced conductors within each plane so as to present a network of relatively thin, closely spaced conductors upon substrate material 76.

Figure 9:
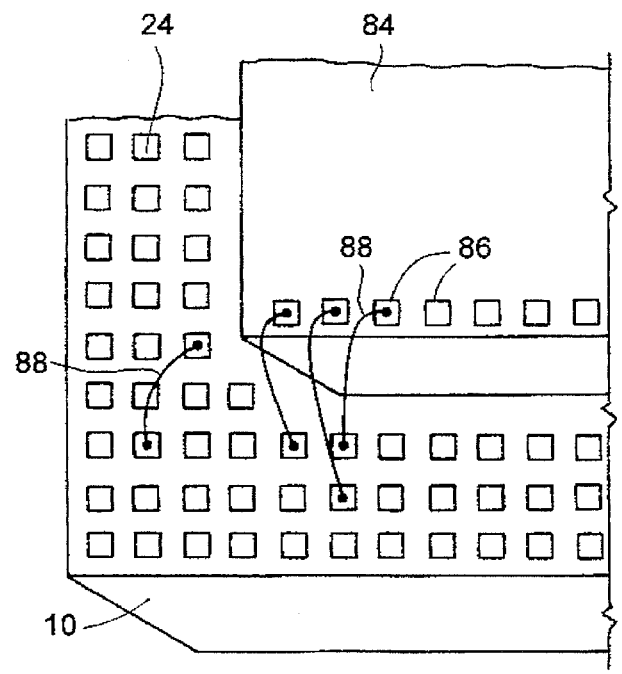
FIG. 9 is a perspective view of an electrical component electrically coupled to bonding pads regularly spaced across the electrical interconnect device according to the present invention.

Referring now to FIG. 9, a portion of an upper surface of electrical interconnect device 10 is shown upon which an electrical component 84 is placed. Electrical component 84 may include numerous bond areas 86 which can be wire bonded to bonding pads 24 using bond wires 88. Another bond wire can be used to connect one bonding pad 24 to another bonding pad, as shown. After connection is made to a bonding pad, various conductive links and laser cuts can be made to route the bonding pad to signal lines. Routeability is performed anywhere upon interconnective device 10 including areas on which component 84 is placed. Thus, customization is concluded prior to component loading or placement. All that is necessary after the component is placed is to connect bond wires from bond areas 86 to bonding pads 24 or bond wires in re-work areas. A protective coating may be applied over the upper surface of interconnect device 10 after customization in regions where component 84 is to be loaded. For the sake of brevity and drawing clarity, the protective layer is not shown.

Figure 10:
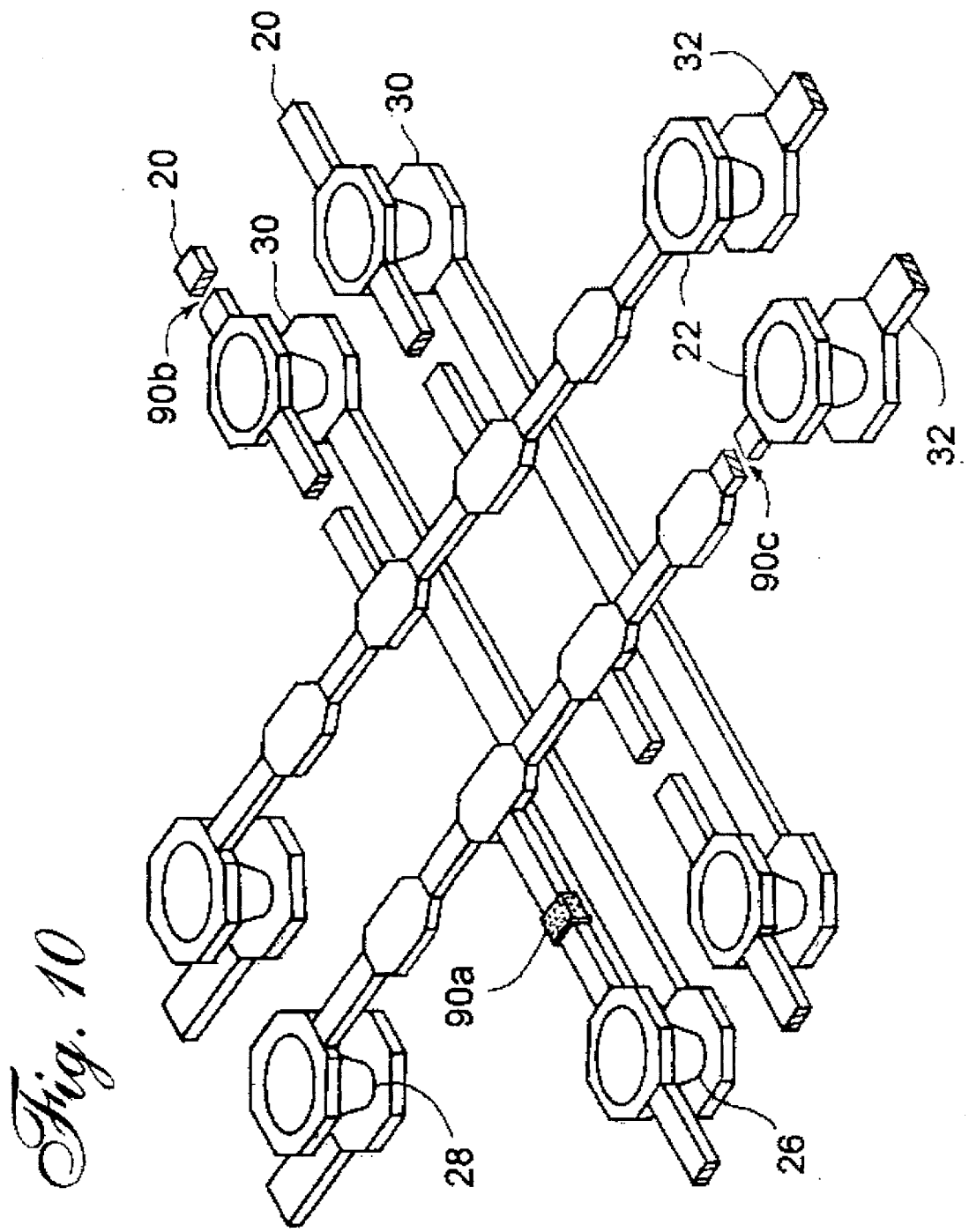
FIG. 10 is a perspective view of the upper and lower signal lines within the interconnect cell illustrative of various routing options according to the present invention.

Referring now to FIG. 10, a perspective view of the upper and lower signal lines within the interconnect cell is illustrated. The upper and lower signal lines are interwoven with each other. First and second vias connect the intermittent spaces between parallel placed upper and lower signal lines to form the interwoven design. A unique aspect of the present invention is the interwoven design. Moreover, surface linkage and separation on the upper surface of the upper signal lines allows customization and full programmability of the interwoven signal lines. For example, to form a corner-turn, one link 90*a* and two cuts 90*b* and 90*c* are required. The corner-turn therefore exists between one of the first upper signal lines 20 to one of the second upper signal lines 22, and the connection to underlying respective lower signal lines is provided by signal vias 26 and 28. If a tee connection is needed, only one link 90*a* and one cut 90*b* are required. Cut 90*c* is not performed in order for one of the first upper signal lines 20 to connect to one of the second upper signal lines 22 and extend in both directions from the link point. If one of the first pair of upper signal lines 20 is to be connected to one of the second pair of upper signal lines 22, then only one link is needed, i.e., link 90*a*. As such, a "X" connection is formed at or near the link site.

It will be appreciated to those skilled in the art having the benefit of this disclosure that this invention is capable of applications with numerous types of electrical components and/or numerous component arrangements and netlists. Furthermore, it is to be understood that the form of the invention shown and described is to be taken as a presently preferred embodiment. Various modifications and changes may be made to the processing steps used to form the conductive planes, all as would be obvious to a person skilled in the art having the benefit of this disclosure. It is intended that the following claims be interpreted to embrace all such modifications and changes and, accordingly, the specifications and drawings are to be regarded in an illustrative rather than a restrictive sense.

What is claimed:

1. An electrical interconnect device comprising:

a plurality of intermittently spaced first pairs of upper signal lines extending parallel to each other across a first plane, said first pairs of upper signal lines are connected at terminal ends thereof to a plurality of intermittently spaced first pairs of lower signal lines extending parallel to each other across a second plane;

a plurality of intermittently spaced second pairs of upper signal lines extending parallel to each other and perpendicular to said first pairs of upper signal lines across said first plane, said second pairs of upper signal lines are connected at terminal ends thereof to a plurality of intermittently spaced second pairs of lower signal lines extending parallel to each other and perpendicular to said first pairs of lower signal lines across said second plane, wherein said first pairs of upper signal lines and said first pairs of lower signal lines are interwoven a spaced distance with said second pairs of upper signal lines and said second pairs of lower signal lines; and a plurality of bonding pads, each of said plurality of bonding pads is arranged upon said first plane in an area between adjacent said first pairs of upper signal lines and between adjacent said second pairs of upper signal lines, and directly above an area between adjacent said first pairs of lower signal lines and between adjacent said second pairs of lower signal lines.

2. The electrical interconnect device as recited in claim 1, further comprising a plurality of pad vias extending perpendicular to said first plane and said second plane, a distance directly beneath and from respective said plurality of bonding pads to a first set of four potential conductors arranged in spaced relation to one another within a third plane, wherein said third plane is electrically isolated from said second plane and said second plane is electrically isolated from said first plane.

3. The electrical interconnect device as recited in claim 1, further comprising a conductive link placeable upon said first plane between at least one of said first pairs of upper signal lines and at least one of said second pairs of upper signal lines, said conductive link is further placeable between at least one of said plurality of bonding pads and at least one of said first pairs of upper signal lines and at least one of said second pairs of upper signal lines.

4. The electrical interconnect device as recited in claim 1, wherein each said intermittently spaced first pairs of upper signal lines comprise two intermittently spaced first upper signal lines extending parallel to one another, and further comprising:

a first axis along which each of said intermittently spaced first upper signal line extends; and an elongated distance extending along said first axis between each of a plurality of intervals formed by said intermittently spaced first upper signal line.

5. The electrical interconnect device as recited in claim 4, wherein said elongated distance is spaced parallel to and directly above each of said first pairs of lower signal lines.

6. The electrical interconnect device as recited in claim 1, wherein each said intermittently spaced second pairs of upper signal lines comprise two intermittently spaced second upper signal lines extending parallel to one another, and further comprising:

a second axis along which each of said intermittently spaced second upper signal line extends; and an elongated distance extending along said second axis between each of a plurality of intervals formed by said intermittently spaced second upper signal line.

7. The electrical interconnect device as recited in claim 6, wherein said elongated distance is spaced parallel to and directly above each of said second pairs of lower signal lines.

8. The electrical interconnect device as recited in claim 1, wherein the terminal ends of said first pairs of upper signal lines are connected to the terminal ends of said first pairs of lower signal lines by a respective plurality of first signal vias arranged between adjacent said bonding pads extending between said first and second planes and perpendicular thereto.

9. The electrical interconnect device as recited in claim 1, wherein the terminal ends of said second pairs of upper signal lines are connected to the terminal ends of said second pairs of lower signal lines by a respective plurality of second signal vias arranged between adjacent said bonding pads extending between said first and second planes and perpendicular thereto.

10. The electrical interconnect device as recited in claim 1, further comprising an electrical component mounted upon said first plane and having at least one bond area adapted for connection to one of said plurality of bonding pads.

11. The electrical interconnect device as recited in claim 1, wherein at least one of said plurality of bonding pads is adapted to receive a bond wire electrically coupled from another one of said plurality of bonding pads.

12. The electrical interconnect device as recited in claim 1, wherein each of said plurality of bonding pads is adapted for conductive linkage to one of said first pairs of upper signal lines and to one of said second pairs of upper signal lines.

13. The electrical interconnect device as recited in claim 1, wherein said first plane is exposed and wherein said first pairs of upper signal lines and said second pairs of upper signal lines are adapted for access and separation at a point along said first and second pairs of upper signal lines.

14. The electrical interconnect device as recited in claim 2, further comprising:

a fourth plane spaced from said third plane, wherein said fourth plane includes a second set of four potential conductors arranged thereon in spaced relation to one another; and means for electrically connecting said second set of four potential conductors within said fourth plane to said first set of four potential conductors within said third plane by said pad vias extending directly beneath respective said bonding pads from said third plane to said fourth plane.

15. An electrical interconnect device comprising:

a plurality of parallel first pairs of upper signal lines extending at intermittently spaced intervals along a first axis and across a first plane, each said intermittently spaced first pairs of upper signal lines comprise two intermittently spaced first upper signal lines extending parallel to one another and along a first axis, and wherein a plurality of elongated first distances exists along said first axis between each of a plurality of intervals formed by said intermittently spaced first upper signal lines;

a plurality of parallel first pairs of lower signal lines extending at regular spaced intervals parallel to said first axis and across a second plane spaced from said first plane, wherein each of said first pairs of lower signal lines is spaced parallel to and directly below each of said elongated first distances;

a plurality of parallel second pairs of upper signal lines extending at regular spaced intervals along a second axis perpendicular to said first axis and across said first plane, each said intermittently spaced second pairs of upper signal lines comprise two intermittently spaced second upper signal lines extending parallel to one another and along a second axis, and wherein a plurality of elongated second distances exists along said second axis between each of a plurality of intervals formed by said intermittently spaced second upper signal lines;

a plurality of parallel second pairs of lower signal lines extending at regular spaced intervals parallel to said second axis and across said second plane, wherein each of said second pairs of lower signal lines is spaced parallel to and directly below each of said elongated second distances;

a plurality of first signal vias connecting the ends of each of said first pairs of upper signal lines to the ends of each of said first pairs of lower signal lines;

a plurality of second signal vias connecting the ends of each of said second pairs of upper signal lines to the ends of each of said second pairs of lower signal lines;

a bonding pad arranged upon said first plane in an upper area between said first pairs of upper signal lines and said second pairs of upper signal lines, wherein said upper area is directly above an area between said first pairs of lower signal lines and said second pairs of lower signal lines; and a pad via extending perpendicular to said first plane a distance directly beneath and from said bonding pad to one of four potential conductors arranged in spaced relation to one another within a third plane and within a fourth plane, said fourth plane is spaced from said third plane and said third plane is spaced from said second plane.

16. The electrical interconnect device as recited in claim 15, further comprising an electrical component mounted upon said first plane and having at least one bond area adapted for connection to one of said plurality of bonding pads.

17. The electrical interconnect device as recited in claim 15, wherein at least one of said plurality of bonding pads is adapted to receive a bond wire electrically coupled from another one of said plurality of bonding pads.

18. The electrical interconnect device as recited in claim 15, wherein each of said plurality of bonding pads is adapted for conductive linkage to one of said first pairs of upper signal lines and to one of said second pairs of upper signal lines.

19. The electrical interconnect device as recited in claim 15, wherein said first plane is exposed and wherein said first pairs of upper signal lines and said second pairs of upper signal lines are adapted for access and separation upon said first plane.

20. An interconnect cell regularly spaced and electrically connected with another said interconnect cell across an electrical interconnect device, said interconnect cell comprising:

- a first pair of upper signal lines extending parallel to each other along a first axis and terminating upon first signal vias arranged at opposing ends of each line of said first pair of upper signal lines;
- a first pair of lower signal lines extending parallel to each other along said first axis in a plane spaced below said first pair of upper signal lines, wherein said first pair of lower signal lines terminate upon said first signal vias and, whereby said first signal vias electrically connect said first pair of lower signal lines to respective said first pair of upper signal lines; and
- a pair of bonding pads arranged coplanar with said first pair of upper signal lines, wherein said first pair of upper signal lines extend at least partially between said bonding pads such that one of said first pair of upper signal lines is spaced from and adapted for connection to one of said pair of bonding pads and the other said first pair of upper signal lines is spaced from and adapted for connection to the other of said pair of bonding pads and, further, wherein at least one of said first pair of upper signal lines is exposed and adapted for separation.

21. The interconnect cell as recited in claim 20, wherein said first signal vias connect said first pair of upper signal lines to said first pair of lower signal lines along said first axis, whereby said first pair of upper signal lines extend a partial distance across said interconnect cell, connect to said first signal vias and thereafter extend on said first pair of lower signal lines the remaining distance across said interconnect cell in a plane dissimilar from the plane on which said upper signal lines are configured.

22. The interconnect cell as recited in claim 20, further comprising a second pair of lower signal lines extending parallel to each other and coplanar with said first pair of lower signal lines, wherein said second pair of lower signal lines are aligned perpendicular with and in a plane directly below said first pair of upper signal lines.

23. The interconnect cell as recited in claim 22, wherein said second pair of lower signal lines extend along an axis which is aligned perpendicular to another axis along which said first pair of lower signal lines extend, and said second pair of lower signal lines are spaced from said first pair of lower signal lines.

24. The interconnect cell as recited in claim 22, wherein said second pair of lower signal lines terminate upon second signal vias coupled to a second pair of upper signal lines extending coplanar and perpendicular with said first pair of upper signal lines.

25. The interconnect cell as recited in claim 20, further comprising at least one pad via extending perpendicular to a plane formed by said pair of bonding pads a distance directly from each of said pair of bonding pads to a potential conductor arranged in a plane below said first pair of upper signal lines and below said first pair of lower signal lines.

26. The interconnect cell as recited in claim 25, wherein said potential conductor has a wider dimension than any one of said pair of lower signal lines and further has a wider dimension than any one of said pair of upper signal lines.

27. The interconnect cell as recited in claim 25, wherein said potential conductor comprises one of two possible ground conductors.

28. The electrical interconnect device as recited in claim 25, wherein said potential conductor comprises one of two possible power conductors.

29. An electrical interconnect device comprising:

- a plurality of intermittently spaced first pairs of upper signal lines extending parallel to each other across a first plane, said first pairs of upper signal lines are connected at terminal ends thereof to a plurality of intermittently spaced first pairs of lower signal lines extending parallel to each other across a second plane; and
- a plurality of intermittently spaced second pairs of upper signal lines extending parallel to each other and perpendicular to said first pairs of upper signal lines across said first plane, said second pairs of upper signal lines are connected at terminal ends thereof to a plurality of intermittently spaced second pairs of lower signal lines extending parallel to each other and perpendicular to said first pairs of lower signal lines across said second plane.

* * * * *